United States Patent [19]
Oh

[11] Patent Number: 5,444,666
[45] Date of Patent: Aug. 22, 1995

[54] DATA OUTPUT EQUIPMENT FOR A SEMICONDUCTOR MEMORY DEVICE

[75] Inventor: Young N. Oh, Kyungki, Rep. of Korea

[73] Assignee: Hyundai Electronics Industries Co., Ltd., Kyungki, Rep. of Korea

[21] Appl. No.: 339,189

[22] Filed: Nov. 10, 1994

[30] Foreign Application Priority Data

Nov. 11, 1993 [KR] Rep. of Korea ............. 93-23901

[51] Int. Cl.6 ............................................. G11C 13/00
[52] U.S. Cl. ................................. 365/230.08; 365/96
[58] Field of Search ............... 365/230.08, 189.01, 365/230.01, 96

[56] References Cited

U.S. PATENT DOCUMENTS

| | | | |
|---|---|---|---|
| 4,042,950 | 8/1977 | Price | 365/189.01 |
| 5,056,064 | 10/1991 | Iwahashi et al. | 365/233.5 |

Primary Examiner—Terrell W. Fears
Attorney, Agent, or Firm—Fish & Richardson

[57] ABSTRACT

A data output equipment for a semiconductor memory device is disclosed. The data output equipment makes a reading data from a memory cell to output via a data output buffer when a data output buffer enable signal generated by a detect signal from a fuse programmable delay controller or a bond pad is applied to the data output buffer.

7 Claims, 5 Drawing Sheets

"PRIOR ART"

"PRIOR ART"

5,444,666

1

DATA OUTPUT EQUIPMENT FOR A SEMICONDUCTOR MEMORY DEVICE

FIELD OF THE INVENTION

This invention relates to a data output equipment for a semiconductor memory device, and more particularly, to a data output equipment for a semiconductor memory device, which makes a reading data from a memory cell to output through a data output buffer when a data output buffer enable signal, generated by a detecting signal from a fuse programmable delay controller or a bond pad, is applied to the data output buffer.

INFORMATION DISCLOSURE STATEMENT

Generally, a semiconductor memory device is comprised of a memory cell, a sense amplifier and a data output equipment. A data stored in the memory cell is transmitted, via the sense amplifier, to the data equipment while the memory cell is in reading operation.

The semiconductor memory device is further comprised of a redundant circuit which takes over for a failed memory cell when one or more than the plurality of the normal memory cell fails. If such a redundant circuit is in operation, the data transfer speed of a data from the redundant circuit differs from that of a data from the normal memory cell. That is, the time it takes a data from the normal memory cell to transfer to a data output buffer via the sense amplifier differs from the time it takes repaired data by the redundant circuit to transfer to the data output buffer via the sense amplifier. A conventional data output equipment will be illustrated with reference to FIG. 1 and FIG. 2 as follows:

The conventional data output equipment is comprised of a data output enable signal generator 1 and a data output buffer 2. The data output enable signal generator 1 generates a control signal OE (output enable) to enable the data output buffer 2 depending on inputted control signals: ew (early write), cs (column start), ay (y-address latch), cas (column address strobe delayed signal) and oexm (when the memory cell goes into reading operation, the signal oexm is in a logic "high" level, whereas it remains at a logic "low" level when the memory cell is in writing operation). The data output buffer 2 makes a reading data rd from the memory cell (not shown in FIG. 2) to output into an output terminal dour depending on the control signal OE.

FIG. 2 illstrates a detailed circuit of the data output enable signal generator shown in FIG. 1. An electrical operation will be illustrated as described below.

The control signals, ew, cs and ay, maintain in logic "high" while the memory cell is in stand-by operation. The control signals, cs and ay, are inverted into logic "low" by inverters, G1 and G2, of a reading and writing control signal generator 3, respectively. Hence, an output of NAND gate G3 is produced at a logic "high". At this time, if the control signal cas is maintained in logic "low", an output of a NAND gate G5 in the reading and writing control signal generator 3 maintains in logic "high". Therefore, an output node N1 of the reading and writing control signal generator 3 is latched in logic "high" since an output of a NAND gate G4 in the reading and writing control signal generator 3 converts to logic "high". The logic "high" level of the output node N1 is inverted into logic "low" by an inverter G6. If the control signal OEXM remains in logic "low", an output of an NAND gate G7 maintains in logic "high" and is

2 inverted into logic "low" by an inverter G8. Accordingly, the data output enable signal OE remains in logic "low", thereby disabling the data output buffer 2.

The control signal ew maintains in logic "high", whereas the control signals, cs and ay, remain in logic "low" while the memory cell is in reading operation. The control signals, cs and ay, are inverted into logic "high" by the inverters, G1 and G2, respectively. Therefore, the output of the NAND gate G3 remians in logic "low". If the control signal cas remains in logic "high", the output node N1 is latched in logic "low" since the output of the NAND gate G4 remains in logic "high".

As a result, the output of the inverter G6 maintains in logic "high". At this time, if the control signal oexm remains in logic "high", the output of NAND gate G7 is produced in logic "low" and is inverted into logic "high" by the inverter Therefore, the reading data rd, which is read from the memory cell, is transfered into an output terminal dout by the data output buffer 2.

However, the reading data from the memory cell is classified as a reading data from the normal memory cell and a repaired data which is repaired by the redundant circuit due to a failed normal memory cell. The time it takes to transfer these data into the data output buffer 2 differs for each. The output buffer enable signal OE, to enable the data output buffer 2 is generated by the data output enable signal generator 1. The output buffer enable signal OE, is then applied to the data output buffer 2 regardless of the data transfer speed. Accordingly, a speed delay phenomenon of the reading data rd occurs when the data output buffer goes into operation, thereby generating a reading error of the semiconductor memory device due to the speed delay phenomenon.

Therefore, it is the objective of the present invention to solve the problems set forth above and to provide an improved data output equipment for a semiconductor memory device, which makes a reading data from a memory cell to output through a data output buffer when a data output buffer enable signal, generated by a detecting signal from a fuse programmable delay controller or a bond pad, is applied to the data output buffer.

SUMMARY OF THE INVENTION

A data output equipment for A semiconductor memory device of the present invention is distinguished by specific characteristics as shown in the drawings appended. This invention relates to a data output equipment for a semiconductor memory device which is comprised of a fuse programmable delay controller for generating a detecting signal det depending on a fuse connection; a data output enable signal generator for generating a data output buffer enable signal OE depending on the detecting signal det and control signals, ew, cs, ay, cas and oexm; and a data output buffer to output a reading data from a memory cell depending on the data output enable signal OE.

The fuse programmable delay controller is comprised of a fuse connected between a supply voltage VCC and a node N2; an inverter G9 connected between the node N2 and a node N3; an inverter G10 connected between the node N2 and a det terminal to output the detecting signal det; a transistor Q1 connected between the node N2 and a ground VSS, with the transistor Q1 having a gate electrode connected to the node N2; and a capacitor cap1 connected between the node N2 and the ground VSS.

The data output enable signal generator is comprised of a reading and writing control signal generator to output a logic high signal while the memory cell is in stand-by operation, and to output a logic low signal while the memory cell is in reading operation depending on the control signals, ew, cs, ay and cas, through an output node N1 connected to an input terminal of a NOR gate G15; a time delay circuit having an output node N4 to delay the logic signals from the output node N1 depending on the detecting signal det, with the output node N4 connecting to another input terminal of the NOR gate G15; and a NAND gate G16 having an input terminal connected to an output terminal of the NOR gate 15, another input terminal to receive the control signal oexm and an output terminal connected to an inverter G17 to output the data output buffer enable signal OE.

The time delay circuit is comprised of an inverter G11 having an input terminal connected to the output node N1 and an output terminal connected to an input terminal of a NOR gate G12, with the NOR gate G12 having another input terminal to receive the detecting signal det and an output terminal connected to an inverter G14 of which an output terminal is connected to the output node N4 via an inverter G13.

BRIEF DESCRIPTION OF THE DRAWINGS

For a fuller understanding of the nature and the objective of the invention, reference should be made to the following detailed description in conjunction with the accompanying drawings in which.

Similar references characters refer to similar parts through the several view of the drawings.

DETAILED DESCRIPTION OF THE INVENTION

Figure 1:
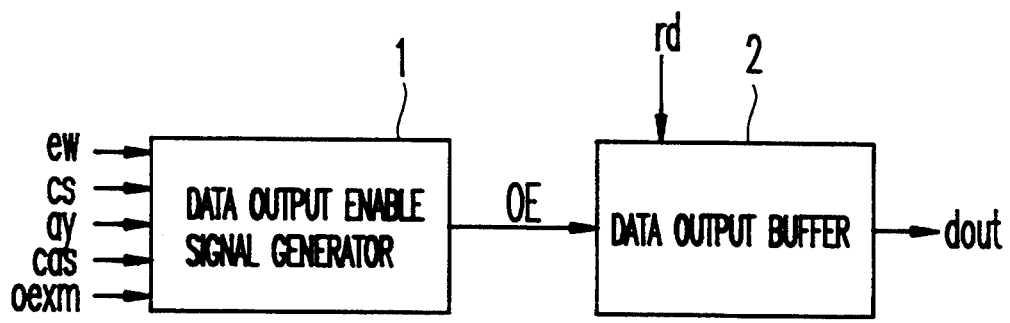
FIG. 1 illustrates a block diagram of a data output equipment for the conventional semiconductor memory device.
Figure 2:
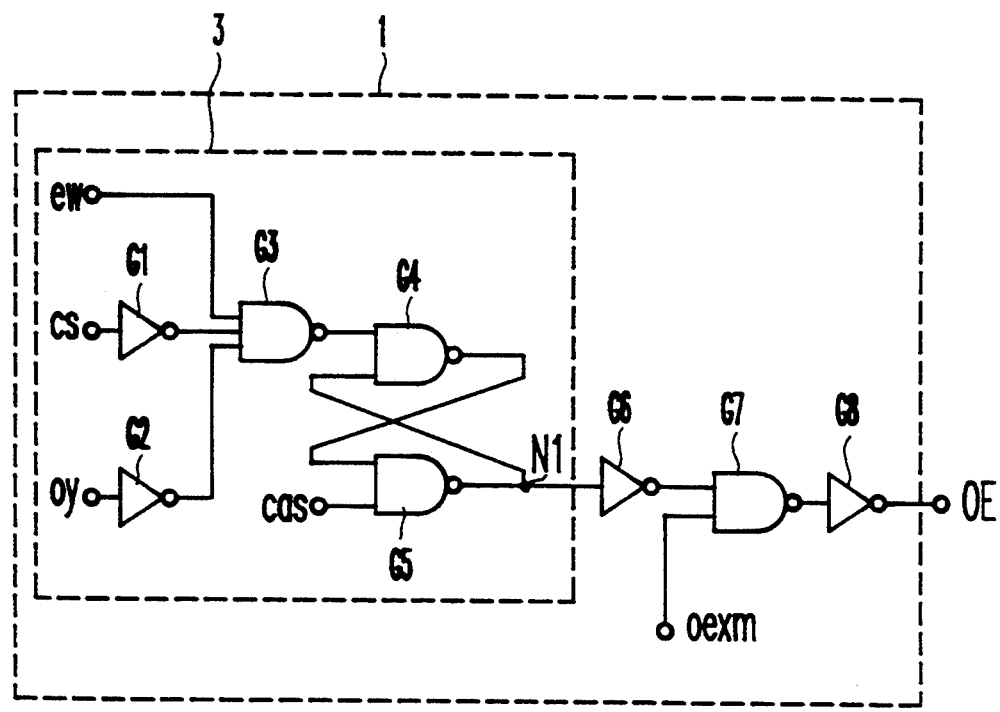
FIG. 2 illustrates a detailed circuit of a data output enable signal generator of FIG. 1.
Figure 3:
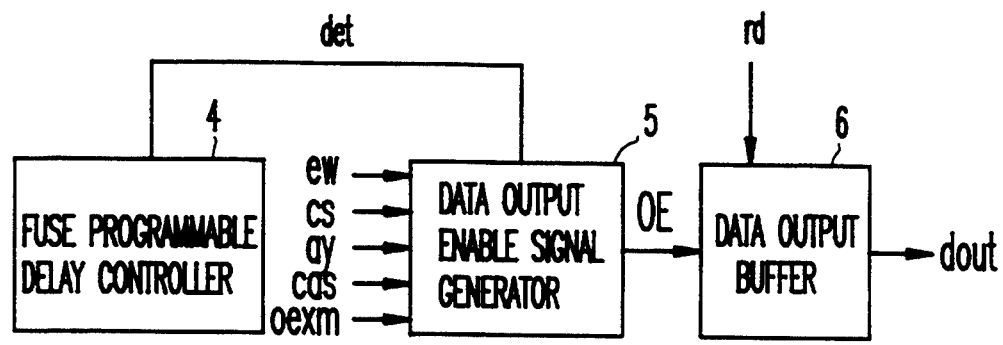
FIG. 3 illustrates a block diagram of a data output equipment for a semiconductor memory device devised according to the present invention.

FIG. 3 illustrates a block diagram of a data output equipment for a semiconductor memory device as intended by the present invention.

A fuse programmable delay controller 4, which produces a logic signal depending on a fuse connection, is connected to a data output enable signal generator 5. The data output enable signal generator 5 is connected to a data output buffer 6. The electrical operation of FIG. 3 can be described as follows.

The fuse programmable delay controller 4 sends to the data output enable signal generator 5 a detecting signal det depending on a fuse connection. The data output enable signal generator 5 generates a data output buffer enable signal OE depending on the detecting signal det and control signals, ew, cs, ay, cas and oexm, and then sends to the data output buffer 6 the data output buffer enable signal OE. The data output buffer 6 makes a reading data rd, which is read from a memory cell to output into an output terminal dout. The detecting signal det, which is detected by the fuse programmable delay controller, controls the critical path time of the data output buffer enable signal OE. The reading data rd may be classified into a repaired data by a redundant circuit and a normal data by a normal memory cell. The critical path of these data differ, thereby generating a delay time between the time that the repaired data is transferred into the data output buffer 6 and the time that the normal data is transferred into the data output buffer 6. Accordingly, the data output buffer enable signal OE is generated after the delay time is passed by the data output enable signal generator 5 when the detecting signal det of the fuse programmable delay controller 4 is sent to the data output enable signal generator 5. The data output buffer 6 is operated by means of the data output enable signal OE, thereby transferring the reading data rd to the output terminal dour.

Figure 4:
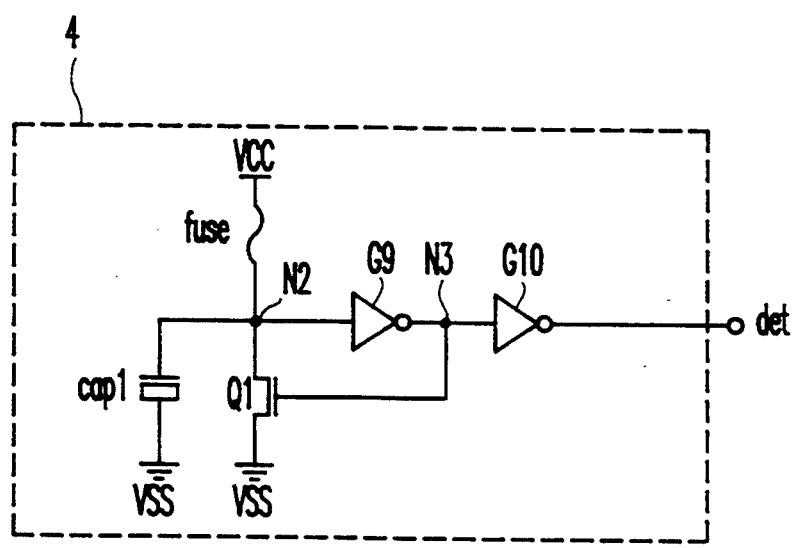
FIG. 4 illustrates a detailed circuit of a fuse programmable delay controller of FIG. 3.

FIG. 4 illustrates a detailed circuit of a fuse programmable delay controller of FIG. 3.

A fuse is connected between a supply voltage VCC and a node N2. An inverter G9 is connected between the node N2 and a node N3. An inverter G10 is connected between the node N2 and a det terminal to produce the detecting signal det. A transistor Q1 is connected between the node N2 and a ground VSS, with the transistor Q1 having a gate electrode connected to the node N2. A capacitor cap1 is connected between the node N2 and the ground VSS. The electrical operation of FIG. 4 will be illustrated as follows.

When the fuse is shorted, that is when the reading data rd is a normal data, the potential level of the node N2 maintains in logic "high". An output of the inverter G9 remains in logic "low", and an output of the inverter G10 remains in logic "high". Therefore, the det terminal remains in logic "high". Whereas, when the fuse is opened, that is when the reading data rd is a repaired data, the potential level of the node N2 maintains in to logic "low". Accordingly, the det terminal remains in logic "low".

Figure 5:
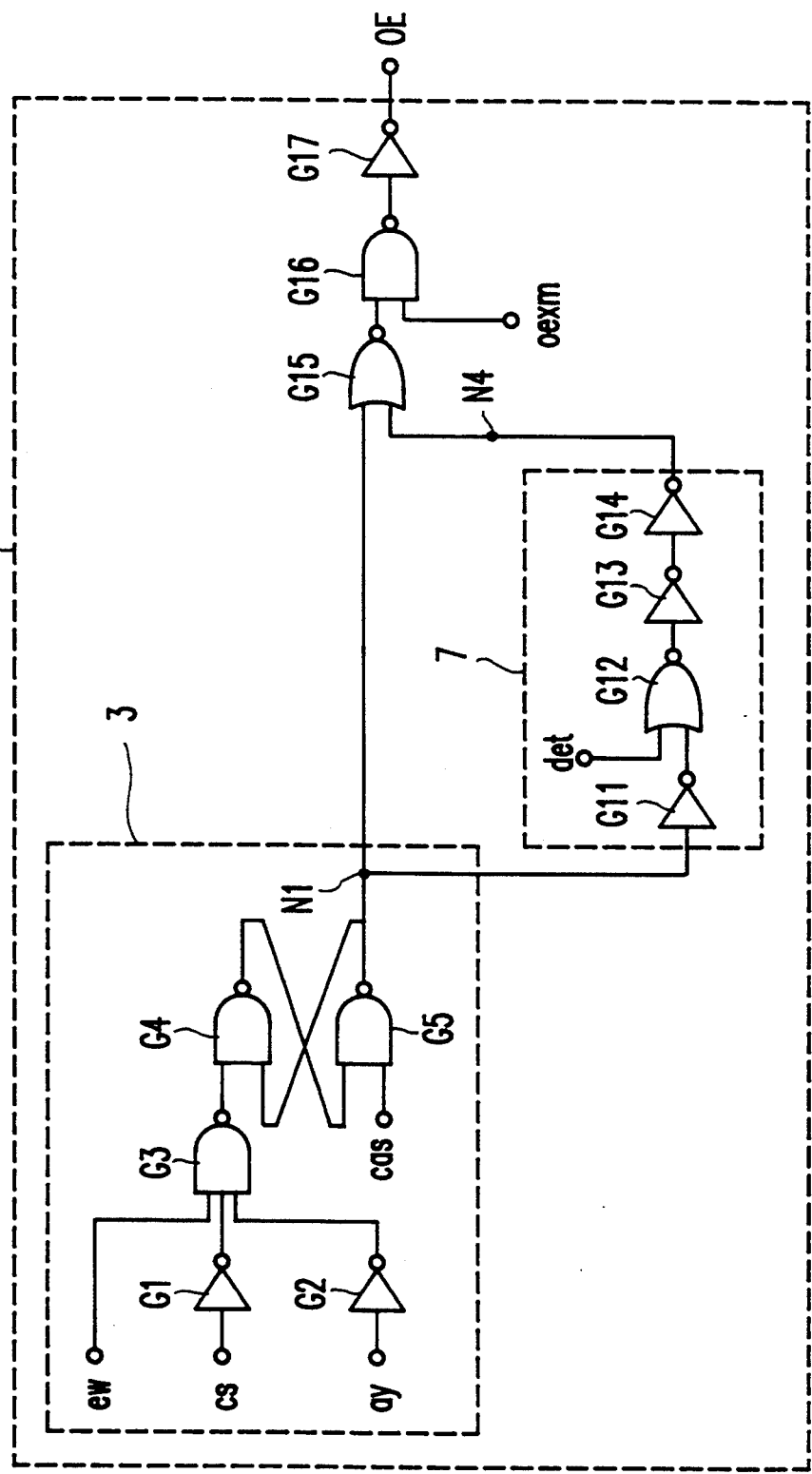
FIG. 5 illustrates a detailed circuit of a data output enable signal generator of FIG. 3.

FIG. 5 illustrates a detailed circuit of a data output enable signal generator of FIG. 3.

The control signals, ew, cs and ay, remain in logic "high" while the memory cell is in stand-by operation. The control signals, cs and ay, are inverted into logic "low" by inverters, G1 and G2, of a reading and writing control signal generator 3, respectively. Hence, an output of a NAND gate G3 maintains in to logic "high". At this time, if the control signal cas remains in logic "low", an output of a NAND gate G5 in the reading and writing control signal generator 3 maintains in logic "high". Therefore, an output node N1 of the reading and writing control signal generator 3 is latched in logic "high" since an output of a NAND gate G4 in the reading and writing control signal generator 3 maintains in logic "high". The logic "high" level of the output node N1 is inverted into logic "low" by a NOR gate G15. Since the control signal OEXM remains in logic "low", an output of NAND gate G16 maintains in logic "high" and is inverted into logic "low" by inverter G17. Accordingly, the data output enable signal OE remains in logic "low", thereby turning off the data output buffer 2.

The control signal ew remains in logic "high", whereas the control signals, cs and ay, remain in logic "low" while the memory cell is in reading operation. The control signals, cs and ay, are inverted in logic "high" by the inverters, G1 and G2, respectively. Therefore, the output of the NAND gate G3 switches to logic "Low". If the control signal cas remains in logic "high", the N1 output node is latched in logic "low" since the output of the NAND gate G4 remains in logic "high". The logic "low" signal of the output node N1 is inverted into logic "high" by an inverter G11 of a time delay circuit 7. At this time, if the detecting signal det, detected by the fuse programmable delay controller 4, is imputed in logic "low" to an input terminal of the NOR gate G12 in the time delay circuit 7, an output of the NOR gate G12 remains in logic "low" since another input terminal of the NOR gate G12 remains in logic "high". Hence, an node N4 connected to an output terminal of an inverter G14 in the time delay circuit 7 remains in logic "low" by means of an inverter G13 and the inverter G14 in the time delay circuit 7. The output of the NOR gate G15 maintains in logic "high" since the nodes and N4 maintain in logic "Low". At this time, if the control signal oexm maintains in logic "high", an output of NAND gate G16 maintains in logic "low" and inverts into logic "high" by the inverter G17. Therefore, the data output buffer enable signal OE remains in logic "high", thereby enabling the data output buffer 6.

In contrast, if the detecting signal det remains in logic "high" while the memory cell is in reading operation, the time delay circuit 7 is disabled and the node N4 maintains in logic "Low". Therefore, the data output buffer enable signal OE maintains in logic "high" regardless the time delay circuit 7.

Figure 6:
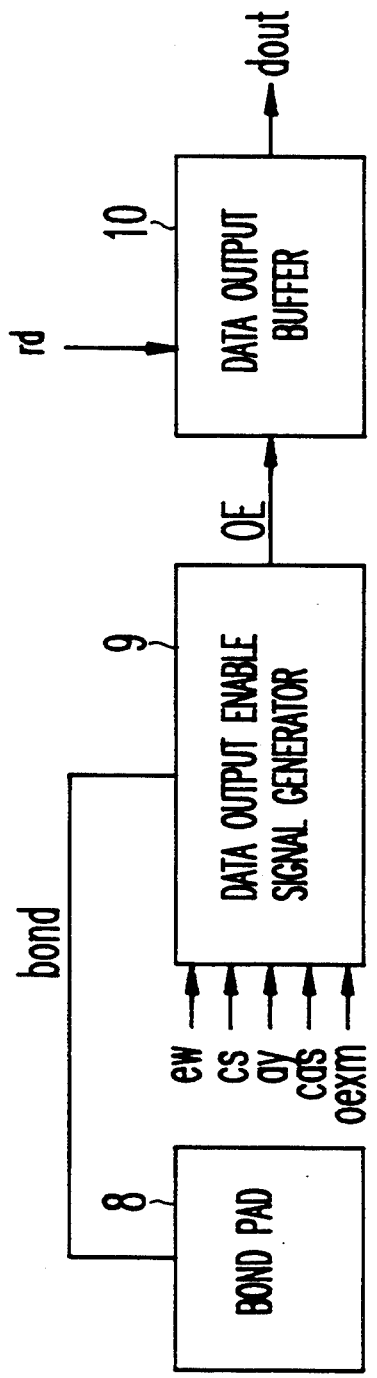
FIG. 6 illustrates an embodiment of the present invention.

Referring to FIG. 6, a VCC voltage source bonding region or a VSS ground bonding region of a bond pad 8 in a lead frame, which is installed on a semiconductor chip, is connected to a data output enable signal generator 9. The data output enable signal generator 9 is connected to a data output buffer 10. The description of FIG. 6 will be omitted because the electrical operation of FIG. 6 is identical to that of FIG. 3 except for utilization of a logic signal bond by the bond pad 8.

Figure 7:
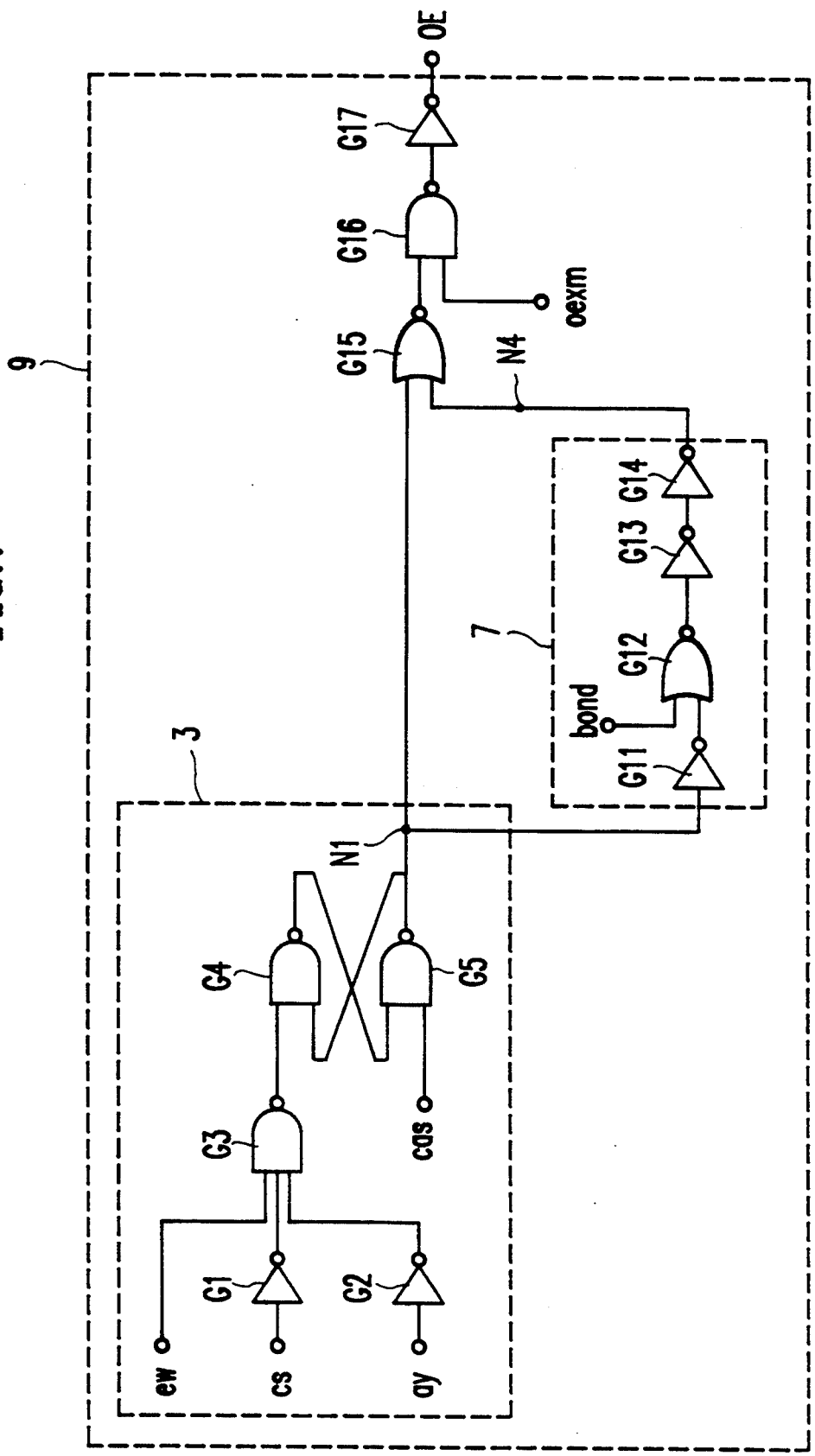
FIG. 7 illustrates a detailed circuit of a data output enable signal generator of FIG. 6.

FIG. 7 illustrates a detailed circuit of a data output enable signal generator of FIG. 6. The description of FIG. 7 will be omitted since the electrical operation of FIG. 7 is identical to that of FIG. 5 except for utilization of the logic signal bond instead of the detecting signal det in the time delay circuit 7.

As mentioned above, according to the present invention, a racing between a data output buffer enable signal and a reading data from a normal memory cell, or between a data output buffer enable signal and a repaired reading data, is accorded. Accordingly, a reading error of a semiconductor memory device due to a time delay of a reading data is protected.

Although this invention has been described in its preferred embodiment with a certain degree of particularity, one skilled in the art would know that the preferred embodiment disclosed here is only an example and that the construction, combination and arrangement of its parts may be varied without departing from the spirit and the scope of the invention.

What is claimed is:

1. A data output equipment for a semiconductor memory device comprises:

a fuse programmable delay controller to generate a detecting signal det depending on a fuse connection;

a data output enable signal generator to generate a data output buffer enable signal OE depending on said detecting signal det and control signals ew, cs, ay, cas and oexm; and a data output buffer to output reading data from a memory cell depending on said data output enable signal OE.

2. The data output equipment of claim 1, wherein said fuse programmable delay controller comprises;

a fuse connected between a supply voltage VCC and a node N2;

an inverter G9 connected between said node N2 and a node N3;

an inverter G10 connected between said node N2 and a det terminal to output said detecting signal det;

a transistor Q1 connected between said node N2 and a ground VSS, with said transistor Q1 having a gate electrode connected to said node N2; and a capacitor cap1 connected between said node N2 and said ground VSS.

3. The data output equipment of claim 1, wherein said data output enable signal generator comprises:

a reading and writing control signal generator to output a logic high signal while said memory cell is in stand-by operation, and to output a logic low signal while said memory cell is in reading operation depending on said control signal ew, cs, ay and cas through an output node N1 connected to an input terminal of NOR gate G15;

a time delay circuit having an output node N4 to delay said logic signals from said output node N1 depending on said detecting signal det, with said output node N4 connecting to another input terminal of said NOR gate G15; and a NAND gate G16 having an input terminal connected to an output terminal of said NOR gate 15, another input terminal to receive said control signal oexm and an output terminal connected to a inverter G17 to output said data output buffer enable signal OE.

4. The data output equipment of claim 3, wherein said time delay circuit comprises an inverter G11 having an input terminal connected to said output node N1 and an output terminal connected to an input terminal of a NOR gate G12, with said NOR gate G12 having another input terminal to receive said detecting signal det and an output terminal connected to an inverter G14 of which an output terminal is connected to said output node N4 via an inverter G13.

5. A data output equipment for a semiconductor memory device comprises:

a bond pad having a VCC voltage source bonding region and a VSS ground bonding region;

a data output enable signal generator to generate a data output buffer enable signal OE depending on an logic signal bond of said bond pad and control signals ew, cs, ay, cas and oexm; and a data output buffer to output reading data from a memory cell according to said data output enable signal OE.

6. The data output equipment of claim 5, wherein said data output enable signal generator comprises:

a reading and writing control signal generator to output a logic high signal while said memory cell is in stand-by operation, and to output a logic low signal while said memory cell is in reading operation depending on said control signal ew, cs, ay and cas through an output node N1 connected to an input terminal of NOR gate G15;

a time delay circuit having an output node N4 to delay said logic signals from said output node N1 depending on said logic signal bond, with said output node N4 connecting to another input terminal of said NOR gate G15; and a NAND gate G16 having an input terminal connected to an output terminal of said NOR gate 15, another input terminal to receive said control signal oexm and an output terminal connected to a inverter G17 to output said data output buffer enable signal OE.

7. The data output equipment of claim 6, wherein said time delay circuit comprises an inverter G11 having an input terminal connected to said output terminal N1 and an output terminal connected to an input terminal of a NOR gate G12, with said NOR gate G12 having another input terminal to receive said logic signal bond and an output terminal connected to an inverter G14 of which an output terminal is connected to said output node N4 via an inverter G13.

* * * * *